United States Patent
Maynard et al.

(10) Patent No.: US 11,292,201 B2
(45) Date of Patent: Apr. 5, 2022

(54) ADDITIVE SWEPT WEDGE BUILDUP TOOLPATH

(71) Applicant: Siemens Industry Software Inc., Plano, TX (US)

(72) Inventors: James Maynard, Chino Hills, CA (US); Michael Taesch, Rochester Hills, MI (US); Timothy R. Fithian, Commerce Township, MI (US); William Vittitow, Garden Grove, CA (US); Mai-Anh T Bui, Huntington Beach, CA (US); Ashish Joshi, Cypress, CA (US)

(73) Assignee: Siemens Industry Software Inc., Plano, TX (US)

( * ) Notice: Subject to any disclaimer, the term of this patent is extended or adjusted under 35 U.S.C. 154(b) by 145 days.

(21) Appl. No.: 16/476,629

(22) PCT Filed: Sep. 5, 2018

(86) PCT No.: PCT/US2018/049446
§ 371 (c)(1),
(2) Date: Jul. 9, 2019

(87) PCT Pub. No.: WO2019/055258
PCT Pub. Date: Mar. 21, 2019

(65) Prior Publication Data
US 2020/0004907 A1    Jan. 2, 2020

Related U.S. Application Data

(60) Provisional application No. 62/557,413, filed on Sep. 12, 2017.

(51) Int. Cl.
*B29C 64/393*        (2017.01)
*G06F 30/20*         (2020.01)
(Continued)

(52) U.S. Cl.
CPC ............ *B29C 64/393* (2017.08); *B33Y 50/00* (2014.12); *G06F 30/20* (2020.01); *B33Y 10/00* (2014.12); *B33Y 30/00* (2014.12); *B33Y 50/02* (2014.12)

(58) Field of Classification Search
CPC ......... G06F 30/20; B33Y 50/00; B33Y 50/02; B33Y 10/00
(Continued)

(56) References Cited

U.S. PATENT DOCUMENTS 6,600,965 B1 * 7/2003 Hull ...................... G03F 7/0037
                                                    700/120
2016/0263832 A1   9/2016 Bui et al.
(Continued)

FOREIGN PATENT DOCUMENTS

CN        105904729 A  *  8/2016

OTHER PUBLICATIONS

Kanakanala, Divya. "Multi axis slicing for rapid prototyping." (2010). Missouri S&T, Masters Theses, 4990 (pp. i-47) retrieved from https://scholarsmine.mst.edu/cgi/viewcontent.cgi?article=5989 &context=masters_theses (Year: 2010).*
Xiangping, Wang, et al. "Adaptive slicing for multi-axis hybrid plasma deposition and milling." Proceedings of the 2014 Annual International Solid Freeform Fabrication Symposium. 2014. pp. 1277-1287 (Year: 2014).*
(Continued)

*Primary Examiner* — Mohammad Ali
*Assistant Examiner* — Joshua T Sanders

(57) ABSTRACT

Systems and methods for designing and manufacturing an additive manufacturing (AM) model. A method includes computing a wedge plane and initial toolpath for an AM model based on a breaking angle. The method includes trimming an excess toolpath of the AM model using a breaking plane. The method includes building the toolpath along the normal of a first layer and trimming based on a next layer. The method includes building a next wedge of the
(Continued)

toolpath in the direction of a wedge plane used to trim a previous wedge The method includes storing the toolpath.

14 Claims, 17 Drawing Sheets

(51) Int. Cl.
  *B33Y 50/00* (2015.01)
  *B33Y 10/00* (2015.01)
  *B33Y 30/00* (2015.01)
  *B33Y 50/02* (2015.01)
(58) Field of Classification Search
  USPC .......................................................... 700/98
  See application file for complete search history.

(56) References Cited

U.S. PATENT DOCUMENTS

2016/0263833 A1   9/2016   Vittitow et al.
2019/0210288 A1*  7/2019   Elber ...................... G06T 17/00

OTHER PUBLICATIONS

Frederik Wulle et al.: "Workpiece and Machine Design in Additive Manufacturing for Multi-Axis Fused Deposition Modeling", Procedia CIRP vol. 60, May 12, 2017, 6 pages.
Donghong Ding et al: "Automatic Multi-Direction Slicing Agorithms for Wire Based Additive Manufacturing", Robotics and Computer Integrated Manufactuing, vol. 37, Feb. 1, 2016, 12 pages.
CNC Software Inc: "Mastercam X5 Router—Master Class Machining", Apr. 9, 2017, 8 pages.
PCT Search Report dated Dec. 10, 2018, for PCT Application No. PCT/US2018/049446, 15 pages.

* cited by examiner

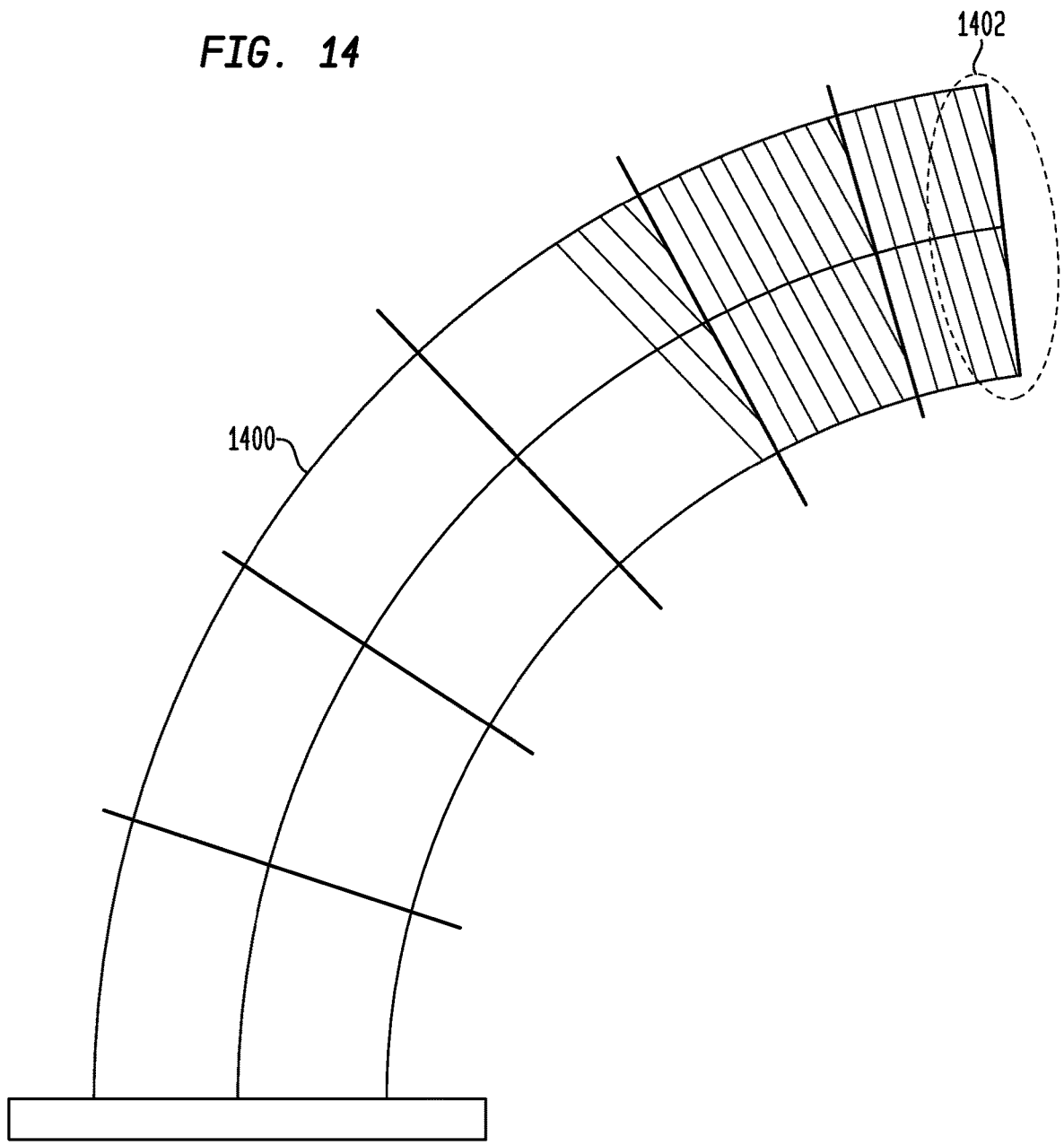

ADDITIVE SWEPT WEDGE BUILDUP TOOLPATH

CROSS-REFERENCE TO RELATED APPLICATION

This application claims the benefit of the filing date of U.S. Provisional Patent Application 62/557,413, filed Sep. 12, 2017, which is hereby incorporated by reference.

TECHNICAL FIELD

The present disclosure is directed, in general, to computer-aided design, visualization, and manufacturing systems (CAD and CAM systems), product lifecycle management ("PLM") systems, and similar systems, that manage data for products and other items (collectively, "Product Data Management" systems or PDM systems), and in particular to such systems as used in additive manufacturing.

BACKGROUND OF THE DISCLOSURE

CAD and CAM systems are used to design and manufacture products. Improved systems are desirable.

SUMMARY OF THE DISCLOSURE

Various embodiments include systems and methods for designing and manufacturing an additive manufacturing (AM) model, performed by a data processing system. The method includes computing a wedge plane and initial toolpath for an additive-manufacturing (AM) model based on a breaking angle. The method includes trimming an excess toolpath of the AM model using a breaking plane. The method includes building the toolpath along the normal of a first layer and trimming based on a next layer. The method includes building a next wedge of the toolpath in the direction of a wedge plane used to trim a previous wedge. The method includes storing the toolpath.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Various embodiments also include receiving the AM model. Various embodiments also include receiving a user input to update the breaking angle to reduce a number of wedges, and in response, automatically adjusting the toolpath. In some embodiments, the toolpath is associative. Various embodiments also include physically manufacturing a physical part according to the AM model or the toolpath. In some embodiments, a physical part can be manufactured using the model or toolpath without requiring support structures. Various embodiments also include physically manufacturing a physical part according to the AM model or the toolpath while performing the other steps of the method, so that each computed wedge in the toolpath is manufactured and trimmed before building the next wedge in the toolpath.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 14 illustrates path trimming on the final wedge in accordance with disclosed embodiments;

DETAILED DESCRIPTION

The figures discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

When depositing material, the velocity of the material deposition can be critical to ensure a constant volume being deposited. One approach to achieve good motion on the machine and to provide good velocity is to build material in a single direction, such as by locking one or two axes of freedom. However, on a swept additive shape, this will result in a toolpath that would require support structures to be built, which is expensive in terms of both time and material. The "toolpath" refers to the path followed by the deposition tool of the additive manufacturing equipment to build successive layers during the manufacturing process (either the physical manufacturing process as controlled by a data processing system or as modeled/simulated in the data processing system).

Figure 1:
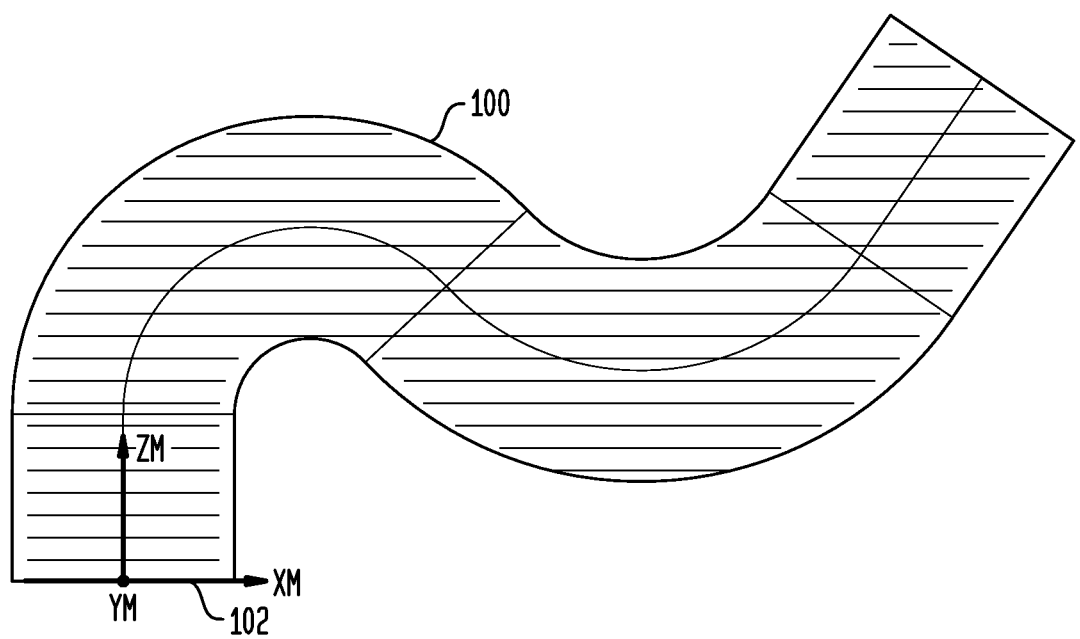
FIG. 1 illustrates a model of an additive-manufacturing swept additive shape used to illustrated disclosed embodiments.

FIG. 1 illustrates a model 100 of an additive-manufacturing swept additive shape what would require substantial support structures in manufacture using conventional techniques. If manufactured using standard deposition techniques starting with base 102, virtually the entire model would require support structures for successful manufacture, for example under all parts of the model that are to the right of base 102.

In order to build such shape with a maximum of single direction deposition, the system can decompose the part in wedges and create a planar toolpath on each wedge. Disclosed embodiments include systems and methods that build a non-constant bended shape. The system can slice the additive geometry along a given spline and build a planar pattern on each layer.

Figure 2:
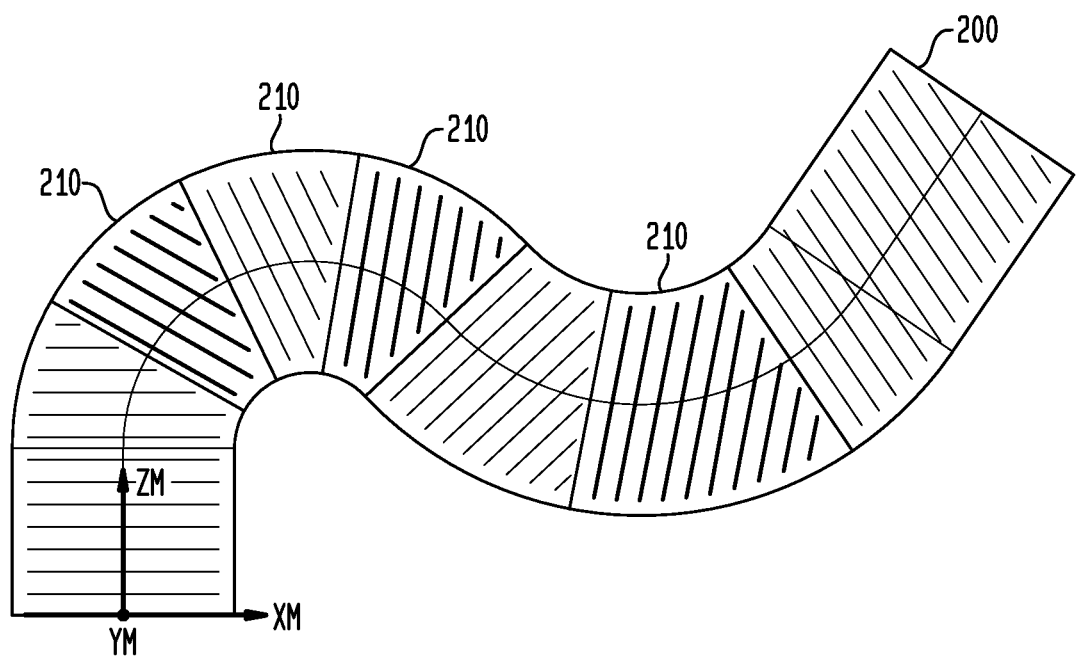
FIG. 2 illustrates wedges on a model of an additive-manufacturing swept additive shape in accordance with disclosed embodiments.

FIG. 2 illustrates wedges 210 on a model 200 of an additive-manufacturing swept additive shape in accordance with disclosed embodiments. Each of the wedges 210 can be separately manufactured using a planar toolpath which together become the entire part represented by model 200.

Such an approach is very tedious and is not optimum as the creation of the wedges requires an empiric approach to find the most appropriate location to split the swept shape into wedges and avoid the "planar" toolpath to go across multiple regions.

Disclosed embodiments provide improved systems and methods for designing and creating an additive swept wedge buildup toolpath for use in an additive manufacturing processing, and in particular in metal-deposition additive manufacturing.

Figure 3:
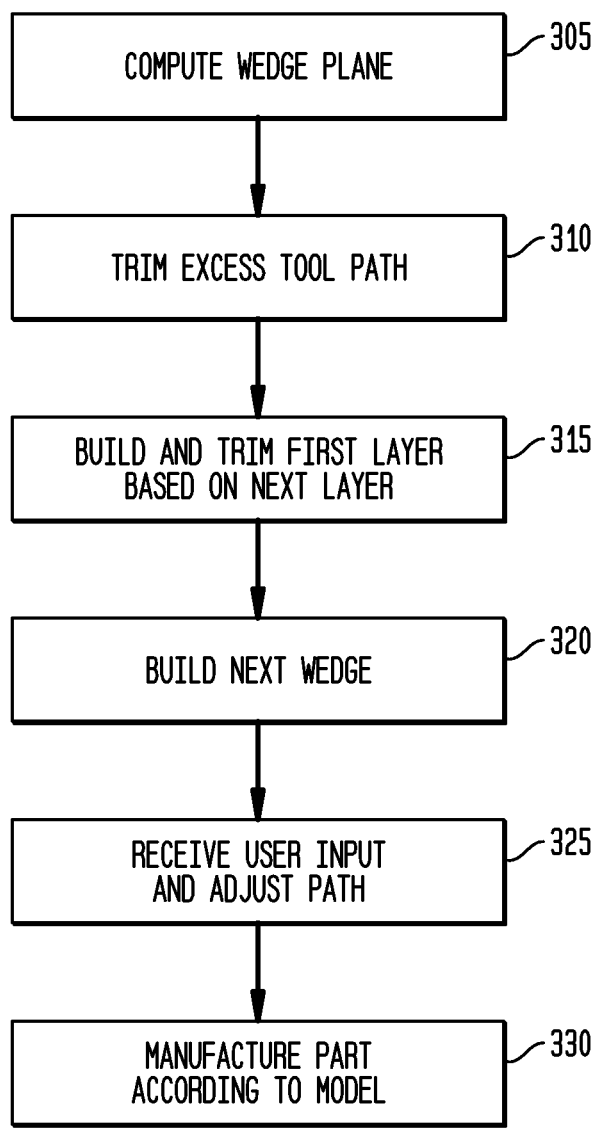
FIG. 3 illustrates a flowchart of a process in accordance with disclosed embodiments.

FIG. 3 illustrates a flowchart of a process in accordance with disclosed embodiments that may be performed, for example, by a CAD, CAM, PLM, or PDM data processing system, referred to generically as the "system" below. Some aspects of the process of FIG. 3 are illustrated with respect to other figures.

The system can compute a wedge plane and initial toolpath for an additive-manufacturing model based on a breaking angle (305). As part of this step, the system can receive the model, such as by loading it from storage, receiving it from another device or process, receiving it via an interaction with a user, or otherwise. In some cases, the system can interact with a user to receive inputs such as an additive feature to be created in the additive manufacturing model, the foundation face or base plane from where the path will start, or a reference central curve or spline used for toolpath generation.

In various embodiments, the foundation face can be a single face or multiple connected faces. The foundation face can be used to specify where the pattern creation starts. For example, one can select a face in the middle of a tube to start the pattern half way through. The face/sheet should preferably be planar.

The central curve or spline can be a single curve or multiple connected curves. The central curve geometry can define the path generation. The direction of the central curve defines the direction of the path.

Figure 4:
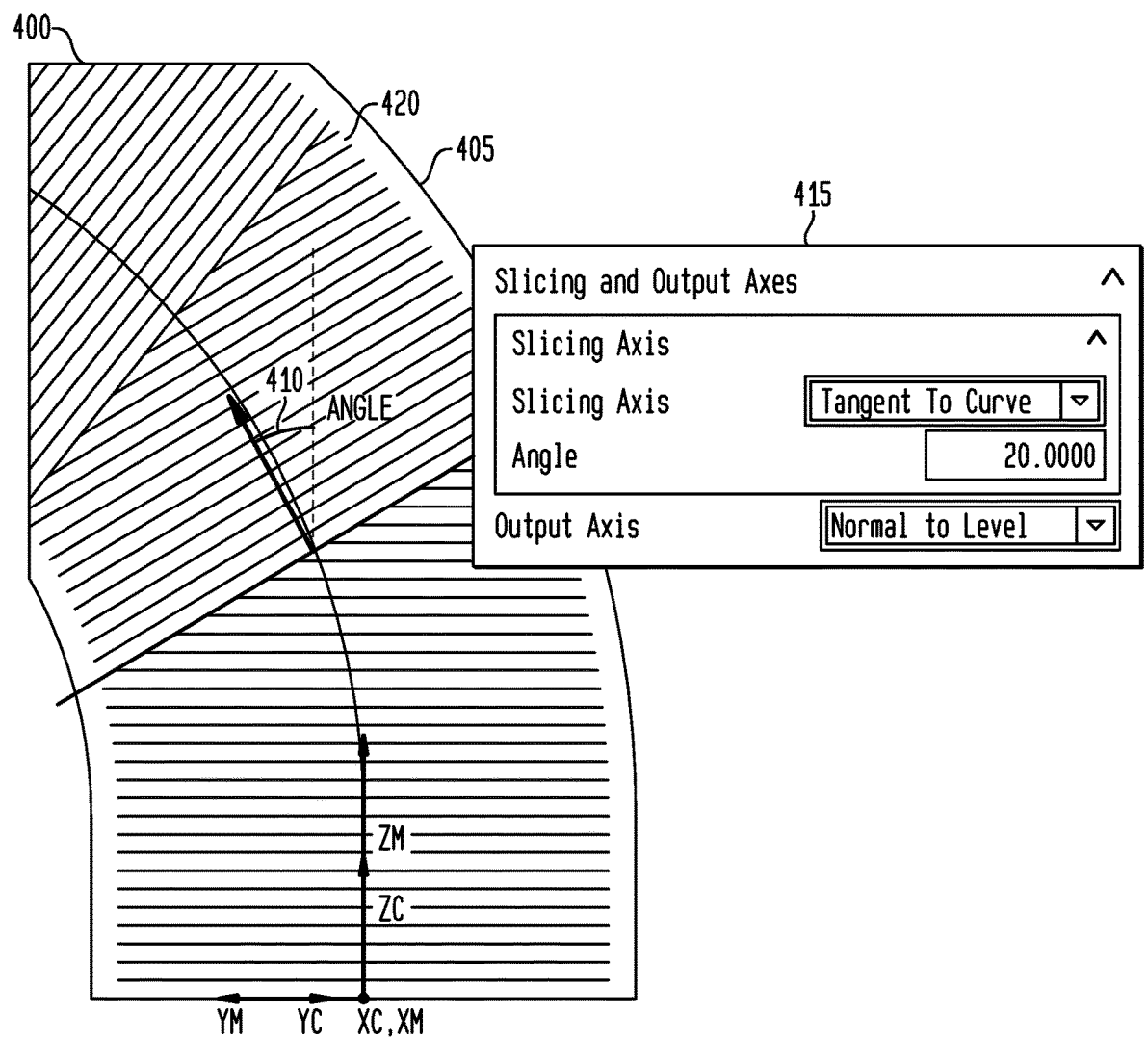
FIG. 4 illustrates computing a wedge plane of a model based on a breaking angle in accordance with disclosed embodiments.

FIG. 4 illustrates computing the wedge plane 405 of model 400 based on breaking angle 410. A user interface 415 allows the system to receive user inputs to specify the slicing axis (in this example, the "Tangent to Curve") and the slicing angle (in this case, 20.0000°) from which the wedge plane is computed. The output axis can also be specified (in this case, "Normal to Level"). The wedges can be created along the central curve/spline based on the slicing angle. The toolpath 420 is represented by the layers of lines showing how the tool deposits material along the toolpath in each wedge.

Returning to the process of FIG. 3, the system can use the breaking plane to trim excess toolpath before starting the next wedge (310).

Figure 5:
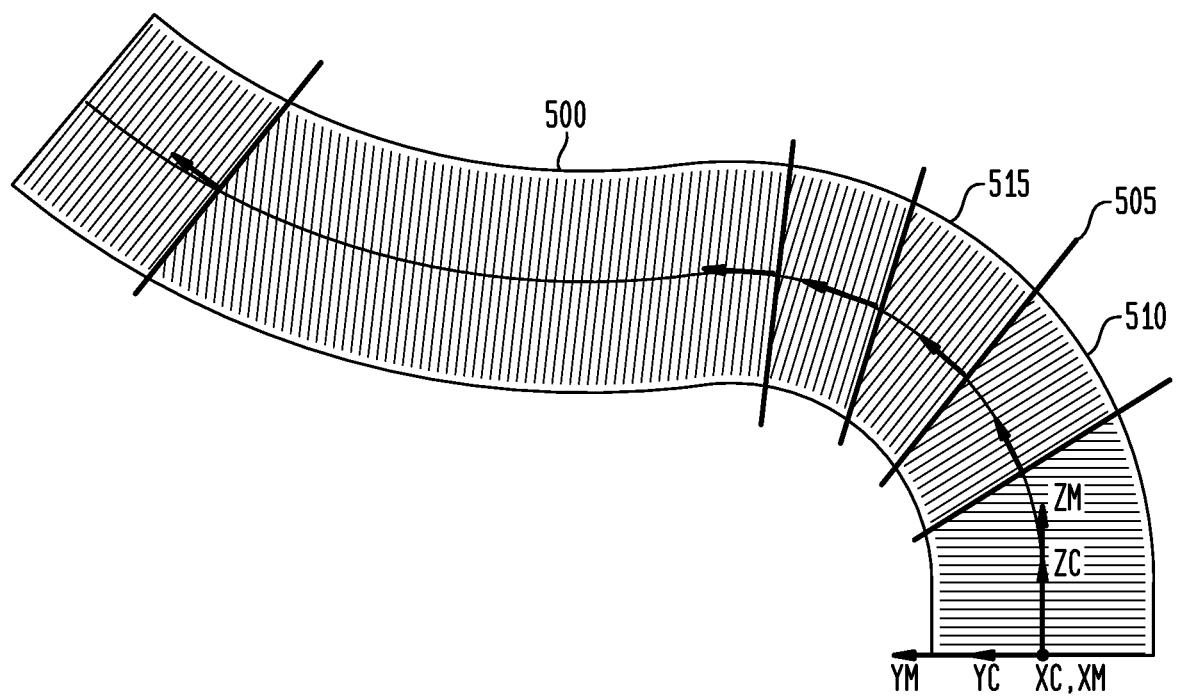
FIG. 5 illustrates trimming the excess toolpath of a model using the breaking plane in accordance with disclosed embodiments.

FIG. 5 illustrates trimming the excess toolpath of model 500 using the breaking plane. Note that, in this figure, each wedge break acts as the boundary between two wedges, and also defines the breaking plane 505 for the corresponding wedge. In this example, breaking plane 505 is used to trim the excess toolpath of wedge 510. Breaking plane 505 defines the deposition plane for wedge 515 (note that the layers shown for wedge 515 are in the plane of breaking plane 505). The breaking plane 505 can be computed along a curve that could be either input manually by the user or computed by the system, depending on implementation. The manual approach may give advanced user the control of the curve used for the computation. By contrast, automatic creation of the curve cam improve the curve for the computation and avoid user interaction.

Returning to the process of FIG. 3, the system can build the toolpath along the normal of the first layer (Z axis) and trim based on the next layer (315). The "deposition axis," in some cases, can be completely independent from the breaking plane and can be controlled independently to improve the overall deposition process, particularly for infill and finish passes, which can improve deposition quality. The deposition axis refers to how the deposition head is positioned to do the material deposition. It can be either aligned with the Slice Axis or a different alignment, for example aligned with the AM shape (Wall Alignment). In many cases, the deposition axis is aligned with the shape being manufactured to ensure good material deposition and surface finish. However, in some cases, the wall alignment, with a 5 axis motion, may be sacrificed to use a more stable process such as 3+2 axis motion.

Figure 6:
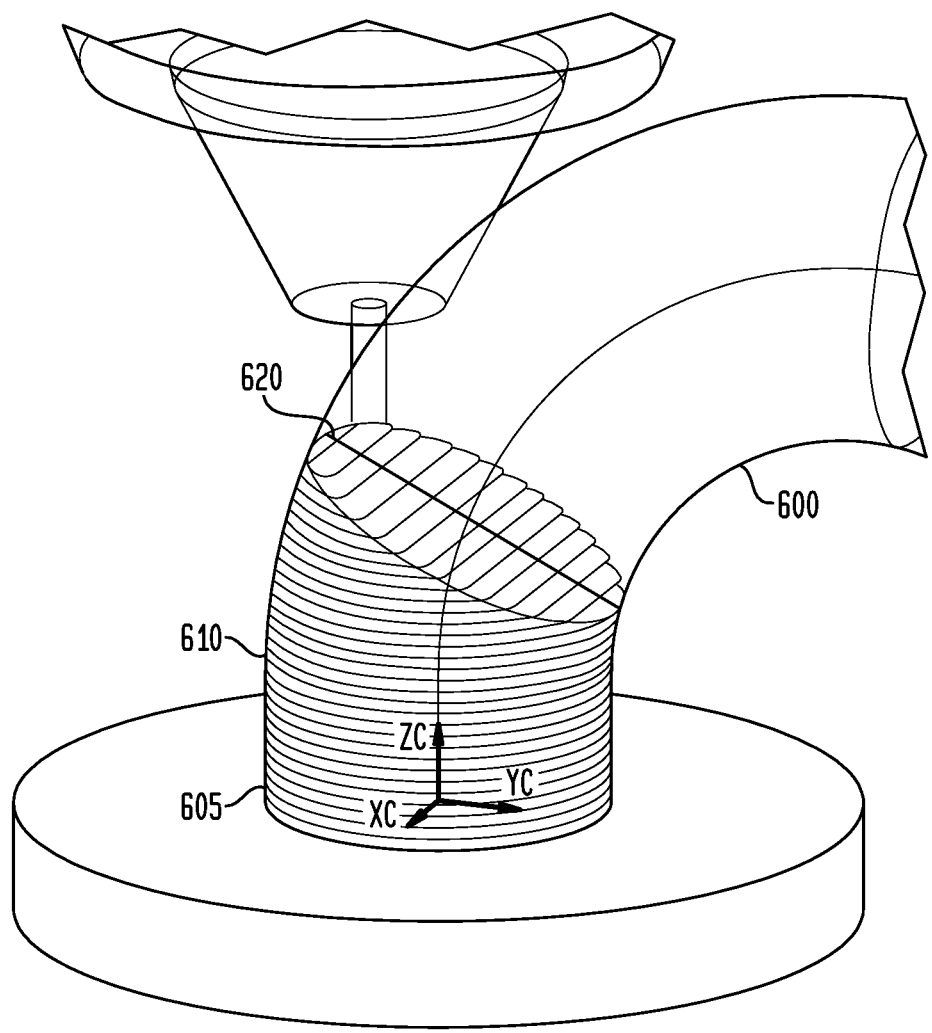
FIG. 6 illustrates building a toolpath for a model along the normal of a first layer in accordance with disclosed embodiments.

FIG. 6 illustrates building the toolpath for model 600 along the normal of the first layer 605. In this example, first layer 605 is horizontal, and the toolpath is built as successive horizontal layers 610 in the vertical (normal to the first layer) direction. The system trims the first wedge based on the next layer, such as trimming along the breaking plane (illustrated by the line at 620) that will define the first layer of the next wedge. The breaking plane is also referred to as the "wedge plane" for the next wedge. Similarly, first layer 605 is on the "wedge plane" for the first wedge of model 600. For each wedge, the system can build a toolpath to be applied in a substantially planar fashion based on the slicing angle.

The toolpath can be built using a number of other parameters that may be user-defined, such as layer pattern, pattern direction, layer thickness, path overhang, minimum or maximum stepover, cut angles, etc. The orientation of the deposition with respect to the additive shape can be defined, such as normal to level (where the deposition axis is constant at each wedge level), fixed vector (where the same tool axis is used for the entire motion, and may be defined by a user), or align tilt from curve (where the deposition axis is based on computing the align point at each layer on the central curve).

Returning to the process of FIG. 3, the system can build the entire next wedge in the direction of the wedge plane used to trim the previous wedge (320).

Figure 7:
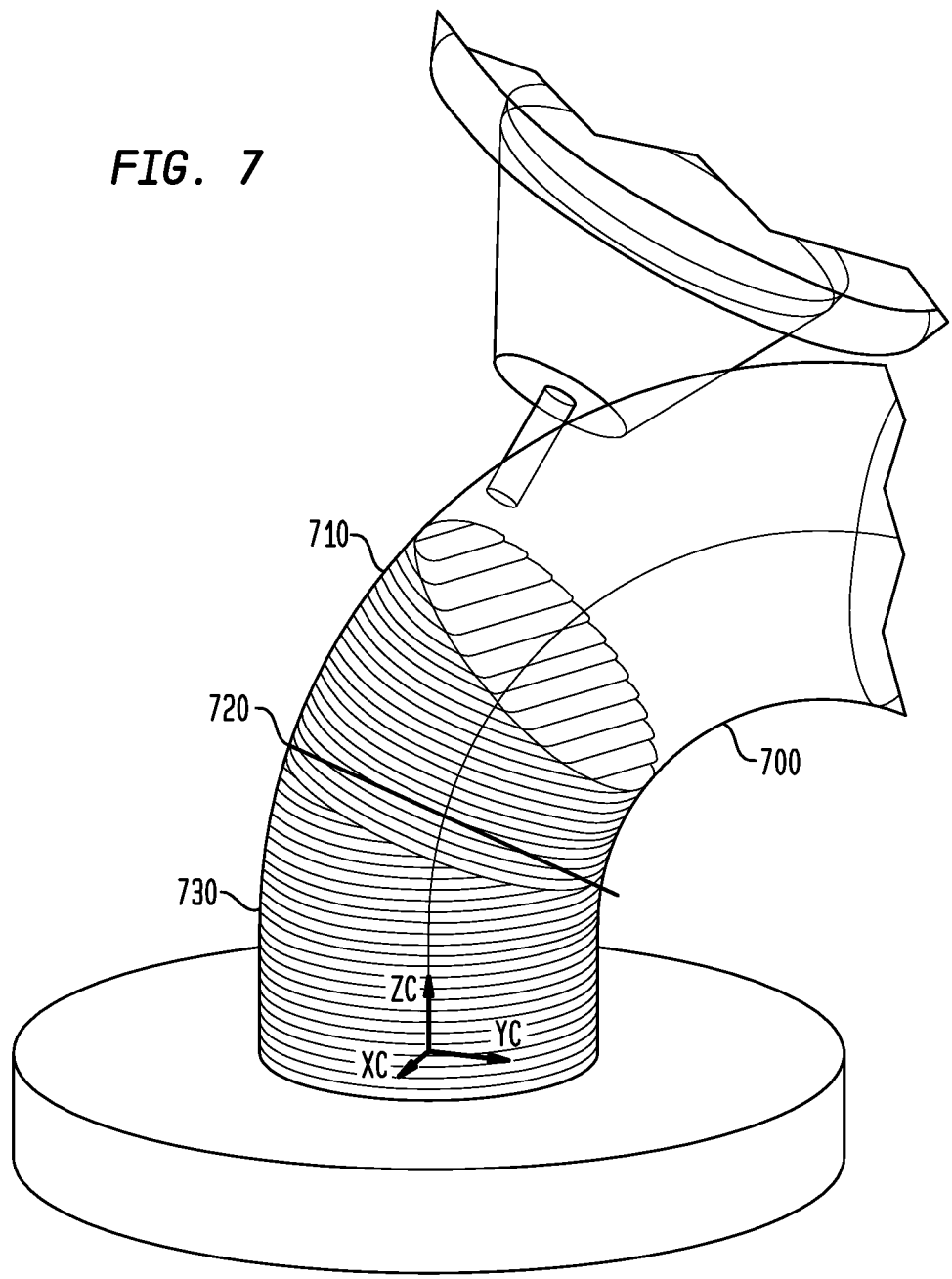
FIG. 7 illustrates building the next wedge in the direction of a wedge plane used to trim the previous wedge in accordance with disclosed embodiments.

FIG. 7 illustrates building the next wedge in the direction of the wedge plane used to trim the previous wedge. In this example, the "next wedge" 710 of model 700 is built by successive layers along the wedge plane (illustrated by the line at 720) that was used to trim the first wedge 730.

Returning to the process of FIG. 3, the system can receive a user input to update the breaking angle (e.g., 410 in FIG. 4) to reduce the number of wedges, and in response, automatically adjust the toolpath (325). The toolpath is associative allowing the user to update the design model.

A process as disclosed herein produces a very smooth toolpath (motion) and an excellent surface of the manufactured part. The toolpath and model can be stored by the system, transmitted to another device or process, or otherwise. Various steps can be repeated as necessary to process the entire toolpath and the wedges as described herein.

The system can physically manufacture a physical part according to the model and/or toolpath (330). The part can be manufactured during this process, where portions or wedges of the part are built then trimmed, and then the process for manufacturing the next wedge portion is repeated with a different angle.

In some embodiments, in conjunction with an automatic wall alignment strategy, the part or model can be created using a constant-volume-deposition approach.

Figure 8:
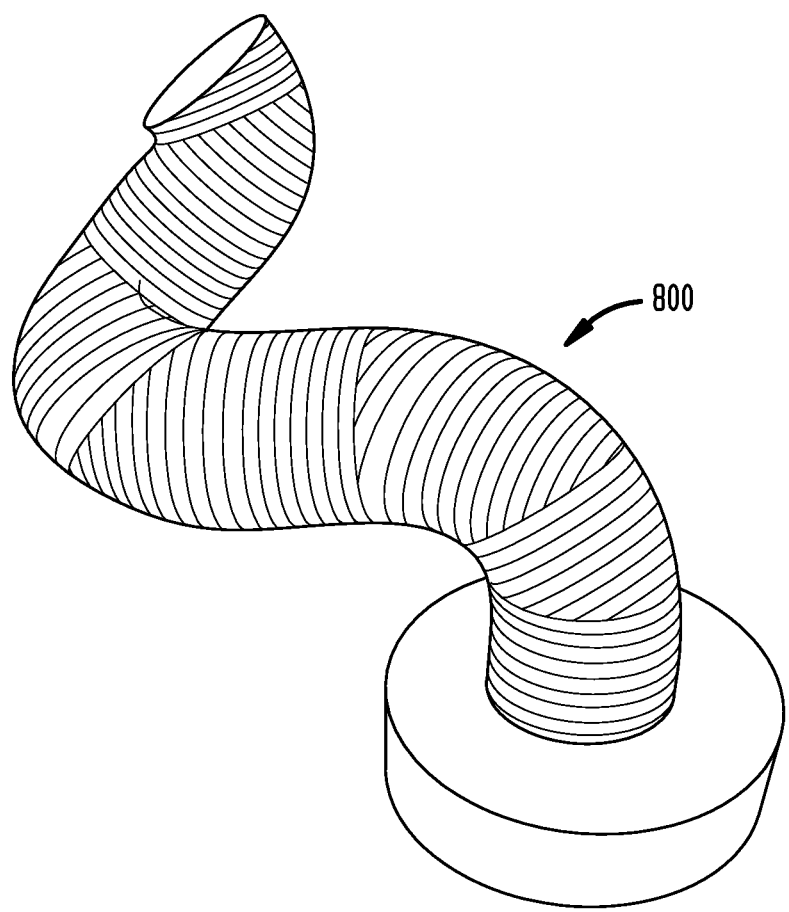
FIG. 8 illustrates an example of a manufactured part from a model designed using a process as disclosed herein.

FIG. 8 illustrates an example of a manufactured part 800 from a model designed using a process as disclosed herein.

Figure 9:
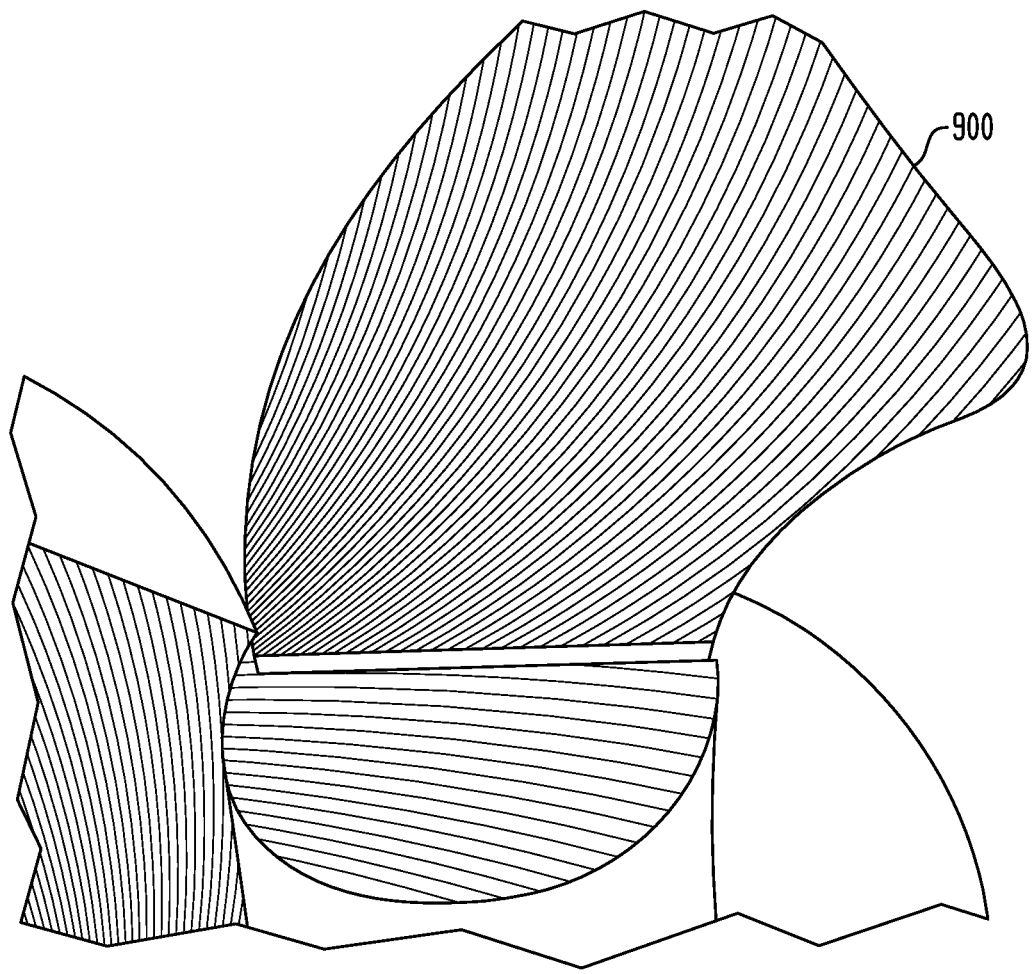
FIG. 9 illustrates an example of a cross-section of a manufactured part from a model designed using a process as disclosed herein.

FIG. 9 illustrates an example of a cross-section of a manufactured part 900 from a model designed using a process as disclosed herein, which can be used to check for porosity at the wedge section.

Figure 10:
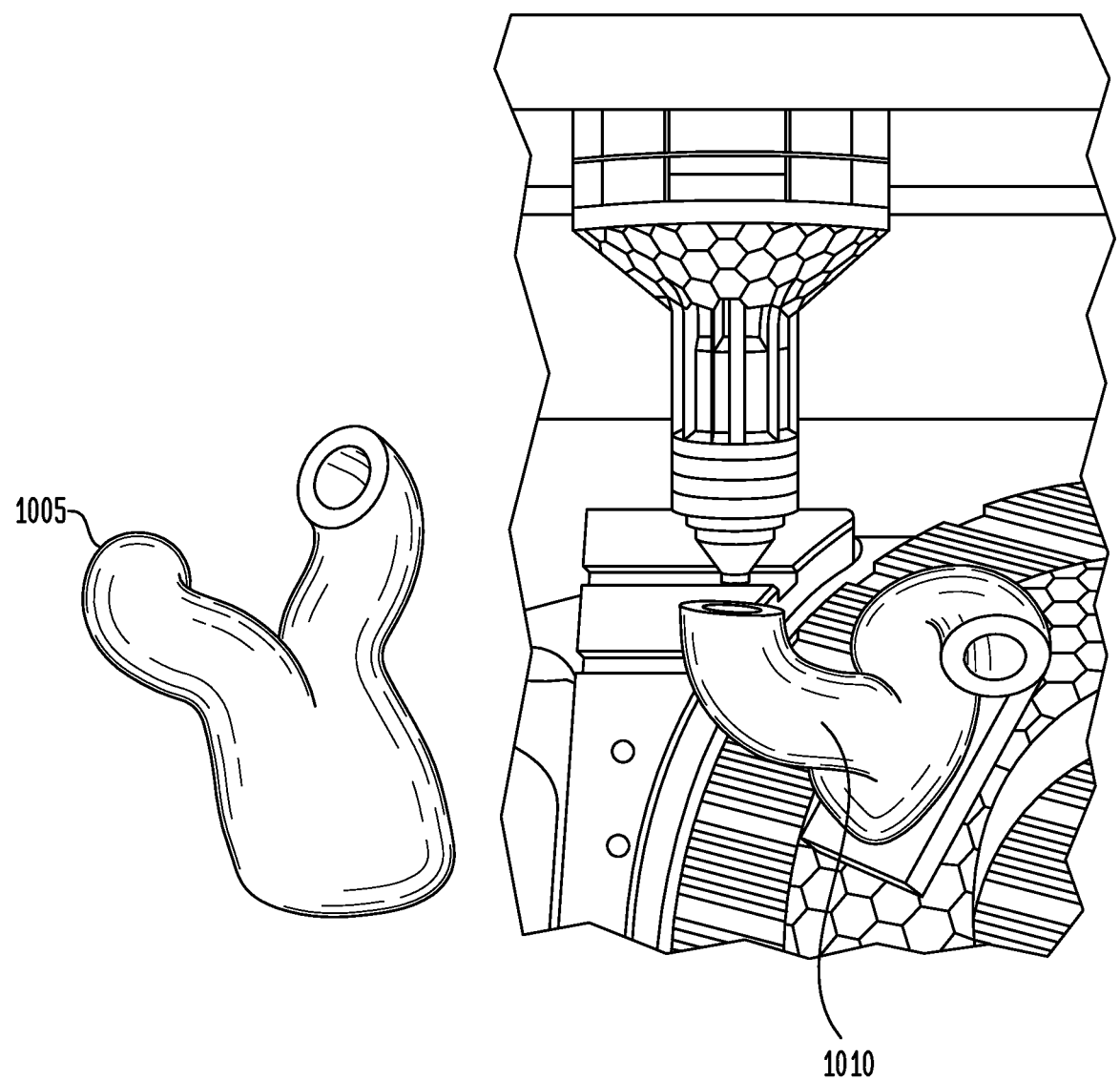
FIG. 10 illustrates other examples of manufactured parts from models designed using a process as disclosed herein.

FIG. 10 illustrates other examples of manufactured parts 1005 and 1010 from models designed using a process as disclosed herein.

Figure 11:
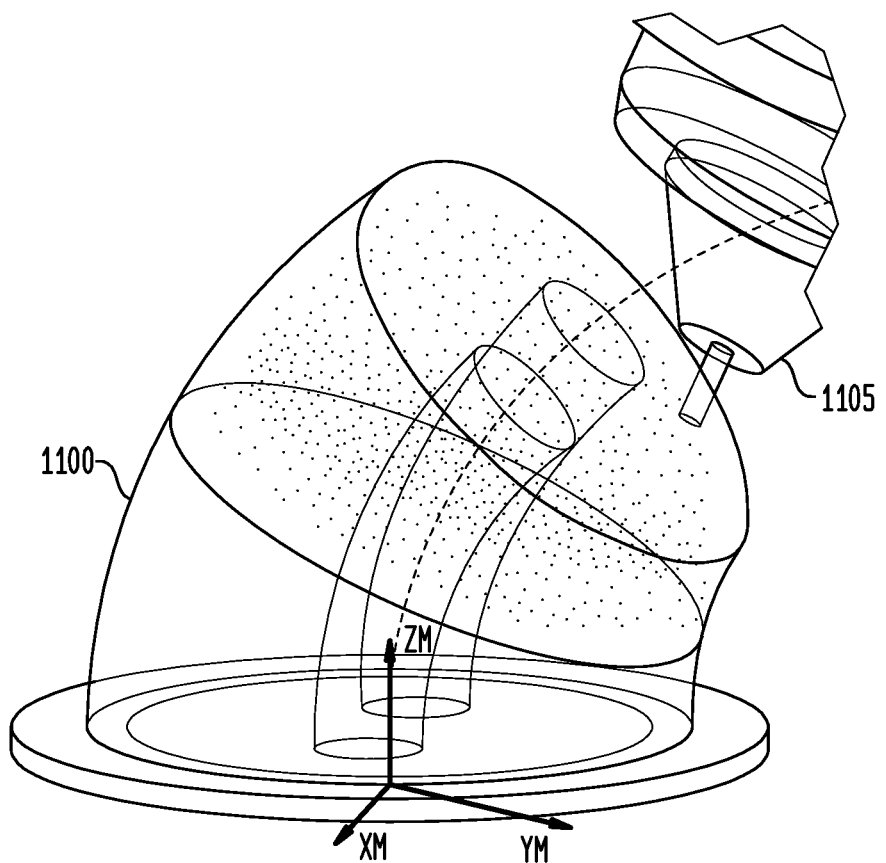
FIG. 11 illustrates an example of a model with a spline curve that can be used by the system to guide a process as disclosed herein

FIG. 11 illustrates a model 1100 with a spline curve 1105 that can be used by the system to guide a process as disclosed herein.

In various embodiments, the last wedge plane can be optimized to avoid trimming of the toolpath and get a better top surface. Further, when two levels within a wedge are parallel and do not require trimming, the system can perform a helical deposition pass (a "finishing pass") around the part to which can produce a better surface finish.

Figure 12A:
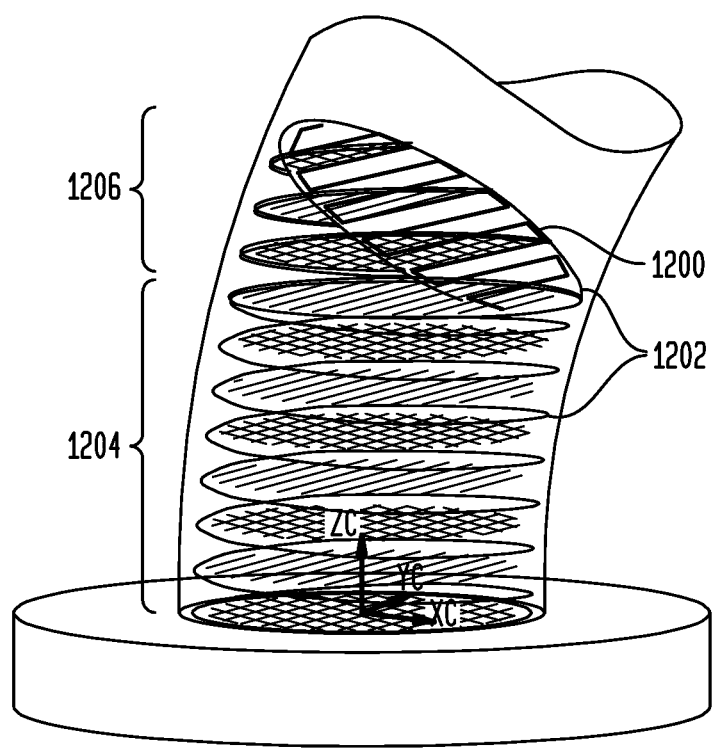
FIGS. 12A and 12B illustrate models 1200 and 1250 using a finish pass in accordance with disclosed embodiments.
Figure 12B:
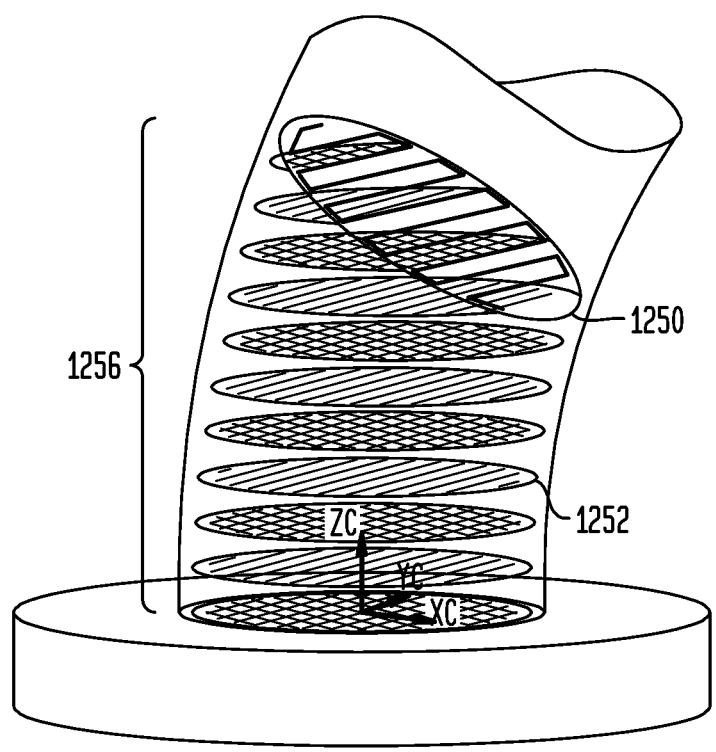

FIGS. 12A and 12B illustrate models 1200 and 1250 using an infill and finish pass strategy (outer profile toolpath) only, in accordance with disclosed embodiments.

FIG. 12A illustrates a process that uses a helical passes strategy detection process. In this example, finishing passes 1202 are shown for model 1200. In area 1204, there is no trim path, and the system can use helical finish passes from level to level. In area 1206, where model 1200 is curving, there is a trimming path, and the system can use a standard trimming pass strategy.

FIG. 12B illustrates a process that does not use a helical passes strategy detection process. In this example, a finishing pass 1252 is shown for model 1250. In area 1256 over the entirety of model 1250, there is a trimming path, and the system can use a standard trimming pass strategy.

Figure 13A:
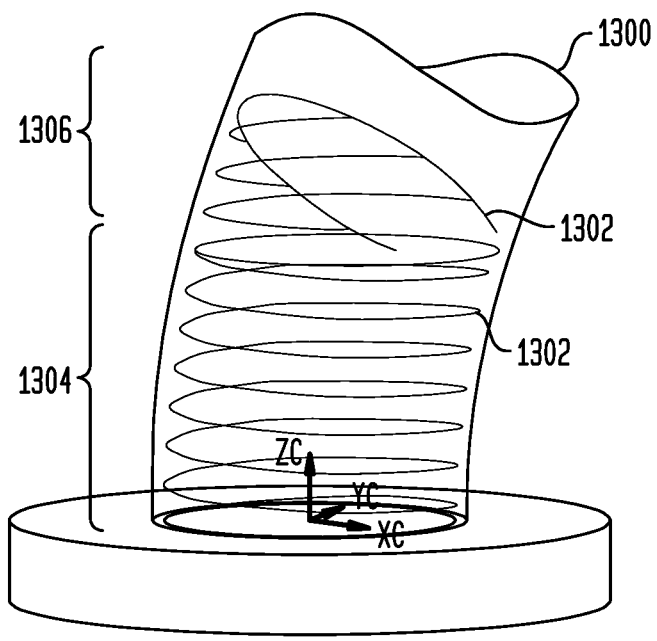
FIGS. 13A and 13B illustrate models 1200 and 1250 using a finish pass in accordance with disclosed embodiments.
Figure 13B:
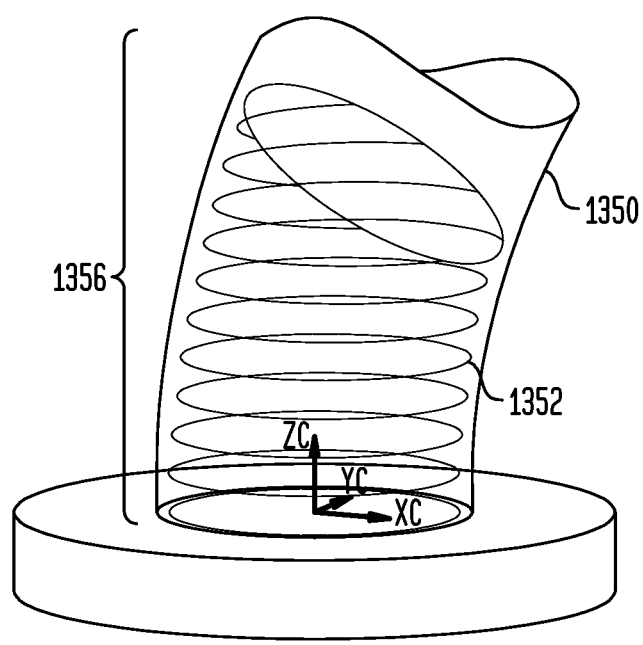

FIGS. 13A and 13B illustrate models 1300 and 1350 using a finish pass strategu (outer profile toolpath) only, in accordance with disclosed embodiments.

FIG. 13A illustrates a process that uses a helical passes strategy detection process. In this example, finishing passes 1302 are shown for model 1300. In area 1304, there is no trim path, and the system can use helical finish passes from level to level. In area 1306, where model 1300 is curving, there is a trimming path, and the system can use a standard trimming pass strategy.

FIG. 13B illustrates a process that does not use a helical passes strategy detection process. In this example, a finishing pass 1352 is shown for model 1350. In area 1356 over the entirety of model 1350, there is a trimming path, and the system can use a standard trimming pass strategy.

FIG. 14 illustrates path trimming on the final wedge in accordance with disclosed embodiments. In this example, model 1400 has been modeled or manufactured as described above. In this case, as illustrated at 1402, the path is interrupted and trimmed at the final wedge.

Figure 15:
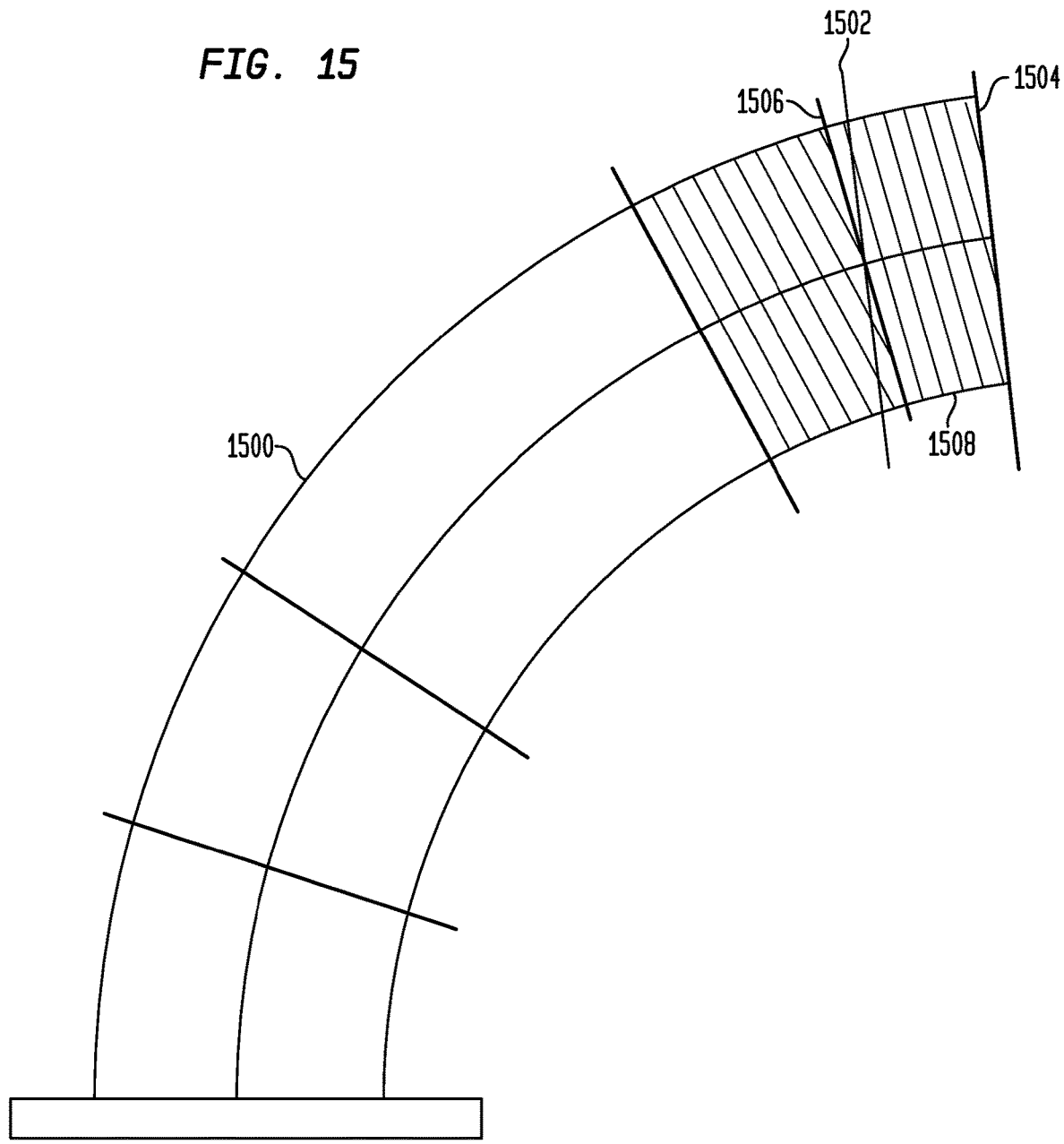
FIG. 15 illustrates determining a final breaking plane in accordance with disclosed embodiments.

FIG. 15 illustrates determining a final breaking plane in accordance with disclosed embodiments. In this example, model 1500 has a final wedge plane 1504. In some embodiments, when available, the system can use the last wedge plane 1504 to determine the reference breaking plane 1502 for the final wedge (so that breaking plane 1502 is parallel to wedge plane 1504), rather than the computed breaking plane 1506. As illustrated in this figure, when the computed breaking plane 1506 is used, the toolpaths 1508 are offset with respect to the last wedge plane 1504, which may lead to an undesirable surface.

Figure 16:
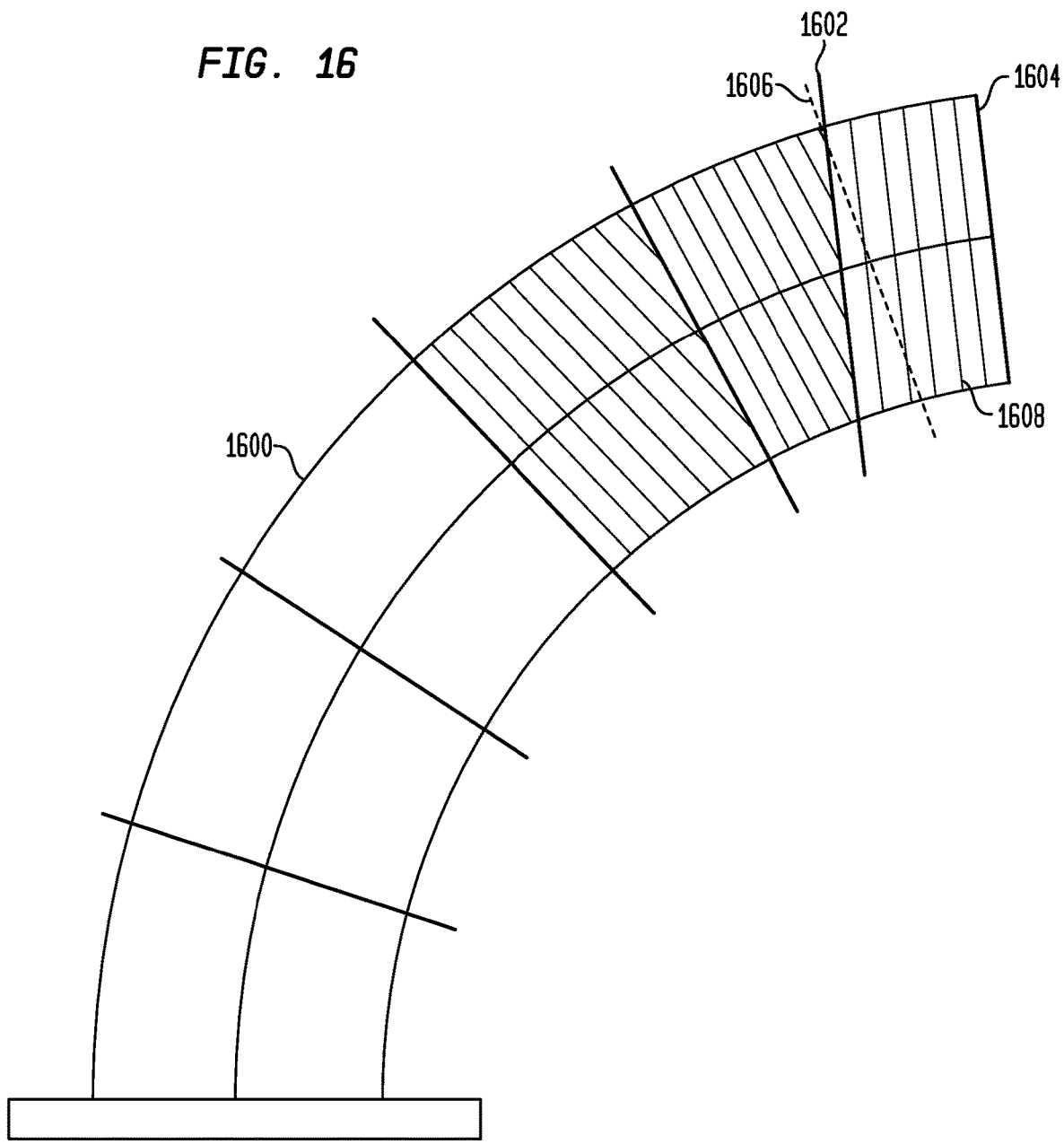
FIG. 16 illustrates determining a final breaking plane in accordance with disclosed embodiments.

FIG. 16 illustrates determining a final breaking plane in accordance with disclosed embodiments. In this example, model 1600 has a final wedge plane 1604. In this example, the system has used the last wedge plane 1604 to determine the reference breaking plane 1602 for the final wedge, rather than the computed breaking plane 1606. As illustrated in this figure, when the breaking plane 1602, parallel to wedge plane 1604, is used, the toolpaths 1608 are aligned with respect to the last wedge plane 1604, providing an improved final surface.

Figure 17:
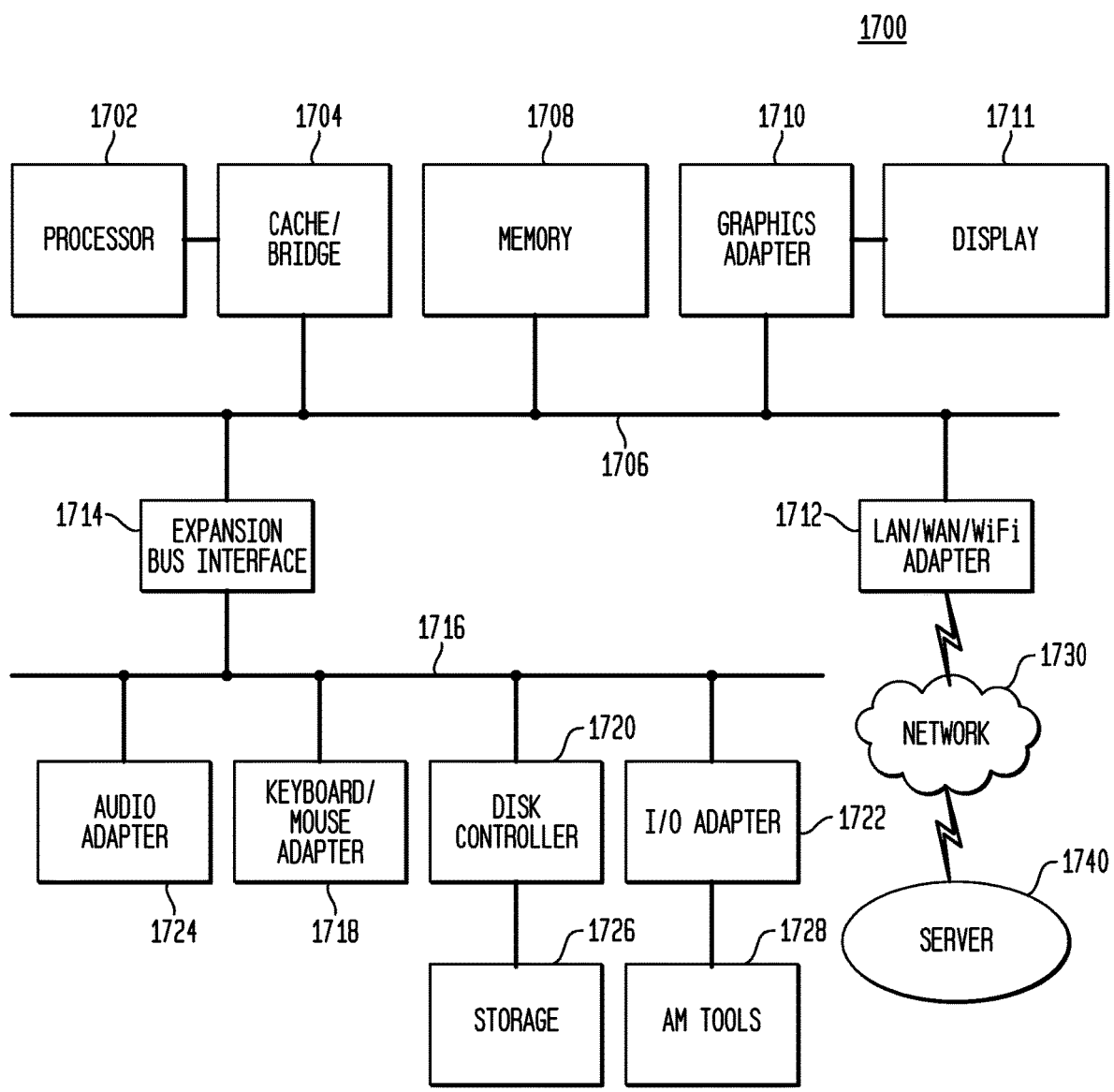
FIG. 17 illustrates a block diagram of a data processing system in which an embodiment can be implemented.

FIG. 17 illustrates a block diagram of a data processing system 1700 in which an embodiment can be implemented, for example as a PDM system particularly configured by software or otherwise to perform the processes as described herein, and in particular as each one of a plurality of interconnected and communicating systems as described herein. The data processing system depicted includes a processor 1702 connected to a level two cache/bridge 1704, which is connected in turn to a local system bus 1706. Local system bus 1706 may be, for example, a peripheral component interconnect (PCI) architecture bus. Also connected to local system bus in the depicted example are a main memory 1708 and a graphics adapter 1710. The graphics adapter 1710 may be connected to display 1711.

Other peripherals, such as local area network (LAN)/Wide Area Network/Wireless (e.g. WiFi) adapter 1712, may also be connected to local system bus 1706. Expansion bus interface 1714 connects local system bus 1706 to input/output (I/O) bus 1716. I/O bus 1716 is connected to keyboard/mouse adapter 1718, disk controller 1720, and I/O adapter 1722. Disk controller 1720 can be connected to a storage 1726, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

I/O adapter 1722 can be connected to communicate with and control additive manufacturing (AM) tools 1728, which can include any hardware or software elements used to perform processes as disclosed herein including physically manufacturing a part.

Also connected to I/O bus 1716 in the example shown is audio adapter 1724, to which speakers (not shown) may be connected for playing sounds. Keyboard/mouse adapter 1718 provides a connection for a pointing device (not shown), such as a mouse, trackball, trackpointer, touchscreen, etc.

Those of ordinary skill in the art will appreciate that the hardware depicted in FIG. 17 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 1712 can be connected to a network 1730 (not a part of data processing system 1700), which can be any public or private data processing system network or combination of networks, as known to those of skill in the art, including the Internet. Data processing system 1700 can communicate over network 1730 with server system 1740, which is also not part of data processing system 1700, but can be implemented, for example, as a separate data processing system 1700.

Any multi-axis additive manufacturing operation that avoids support structures and that split the toolpath within the same operation to avoid varying the amount of material to be deposit would use techniques as disclosed herein. Such a process can include building then trimming, and repeating with a different angle.

Of course, those of skill in the art will recognize that, unless specifically indicated or required by the sequence of operations, certain steps in the processes described above may be omitted, performed concurrently or sequentially, or performed in a different order.

The various techniques, processes, elements, and embodiments described herein can be combined in still further embodiments not expressly described. United States Patent Publications US2016/0263833 and US2016/0263832 are incorporated by reference herein, and the techniques, processes, and other aspects described in those applications can be combined with the techniques disclosed herein in still further embodiments.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 1700 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle. The use of terms such as (but not limited to) "mechanism," "module," "device," "unit," "component," "element," "member," "apparatus," "machine," "system," "processor," or "controller," within a claim is understood and intended to refer to structures known to those skilled in the relevant art, as further modified or enhanced by the features of the claims themselves, and is not intended to invoke 35 U.S.C. § 112(f).

What is claimed is:

1. A method performed by a data processing system, comprising:

computing a wedge plane and initial toolpath for an initial wedge of an additive-manufacturing (AM) model based on a breaking angle;

trimming an excess toolpath for the initial wedge of the AM model using the wedge plane computed for the initial wedge, wherein the wedge plane for the initial wedge is a breaking plane for a second wedge in the AM model;

generating the toolpath for a next wedge of the AM model in a direction normal to a wedge plane used to trim a previous wedge;

determining a final breaking plane for a final wedge of the AM model such that the final breaking plane is parallel to a final wedge plane of the final wedge formed by a part boundary of the AM model and rather than computing the final breaking plane based on the breaking angle;

generating the toolpath for the final wedge of the AM model in a direction normal to the final breaking plane; and storing the toolpath;

further comprising receiving a user input to update the breaking angle to reduce a number of wedges, and in response, automatically adjusting the toolpath.

2. The method of claim 1, further comprising receiving the AM model.

3. The method of claim 1, further comprising physically manufacturing a physical part according to the AM model or the toolpath.

4. The method of claim 1, further comprising physically manufacturing a physical part using the AM model or toolpath without support structures.

5. The method of claim 1, further comprising physically manufacturing a physical part according to the AM model or the toolpath so that each computed wedge in the toolpath is manufactured and trimmed before generating the toolpath for the next wedge.

6. A data processing system comprising:

a processor; and an accessible memory, the data processing system particularly configured to:

compute a wedge plane and initial toolpath for an initial wedge of an additive-manufacturing (AM) model based on a breaking angle;

trim an excess toolpath for the initial wedge of the AM model using the wedge plane computed for the initial wedge, wherein the wedge plane for the initial wedge is a breaking plane for a second wedge in the AM model;

generate the toolpath for a next wedge of the AM model in a direction normal to a wedge plane used to trim a previous wedge;

determine a final breaking plane for a final wedge of the AM model such that the final breaking plane is parallel to a final wedge plane of the final wedge formed by a part boundary of the AM model and rather than computing the final breaking plane based on the breaking angle;

generate the toolpath for the final wedge of the AM model in a direction normal to the final breaking plane; and store the toolpath;

wherein the data processing system is further configured to receive a user input to update the breaking angle to reduce a number of wedges, and in response, automatically adjusting the toolpath.

7. The data processing system of claim 6, wherein the data processing system is further configured to receive the AM model.

8. The data processing system of claim 6, wherein the data processing system is further configured to physically manufacture a physical part according to the AM model or the toolpath.

9. The data processing system of claim 6, wherein the data processing system is configured to physically manufacture a physical part using the AM model or toolpath without support structures.

10. The data processing system of claim 6, wherein the data processing system is further configured to physically manufacture a physical part according to the AM model or the toolpath so that each computed wedge in the toolpath is manufactured and trimmed before generating the toolpath for the next wedge.

11. A non-transitory computer-readable medium encoded with executable instructions that, when executed, cause one or more data processing systems to:

compute a wedge plane and initial toolpath for an initial wedge of an additive-manufacturing (AM) model based on a breaking angle;

trim an excess toolpath for the initial wedge of the AM model using the wedge plane computed for the initial wedge, wherein the wedge plane for the initial wedge is a breaking plane for a second wedge in the AM model;

generate the toolpath for a next wedge of the AM model in a direction normal to a wedge plane used to trim a previous wedge;

determine a final breaking plane for a final wedge of the AM model such that the final breaking plane is parallel to a final wedge plane of the final wedge formed by a part boundary of the AM model and rather than computing the final breaking plane based on the breaking angle;

generate the toolpath for the final wedge of the AM model in a direction normal to the final breaking plane; and store the toolpath;

wherein the non-transitory computer readable medium is further encoded with executable instructions to receive a user input to update the breaking angle to reduce a number of wedges, and in response, automatically adjusting the toolpath.

12. The non-transitory computer-readable medium of claim 11, further encoded with executable instructions to receive the AM model.

13. The non-transitory computer-readable medium of claim 11, further encoded with executable instructions to physically manufacture a physical part according to the AM model or the toolpath without support structures.

14. The non-transitory computer-readable medium of claim 11, further encoded with executable instructions to physically manufacture a physical part according to the AM model or the toolpath so that each computed wedge in the toolpath is manufactured and trimmed before generating the toolpath for the next wedge.

* * * * *